US005384553A

United States Patent [19]

Takeda et al.

[11] Patent Number: 5,384,553

[45] Date of Patent: Jan. 24, 1995

[54] VOLTAGE CONTROL OSCILLATION CIRCUIT

[75] Inventors: Isoshi Takeda; Shigeyoshi Hayashi, both of Kyoto, Japan

[73] Assignee: Rohm Co., Ltd., Kyoto, Japan

[21] Appl. No.: 97,877

[22] Filed: Jul. 27, 1993

[51] Int. Cl.[6] .......................... H03B 5/24; H03L 1/02

[52] U.S. Cl. ...................................... 331/111; 331/44; 331/108 C; 331/143; 331/176

[58] Field of Search ........... 331/34, 44, 108 B, 108 C, 331/108 R, 111, 135, 136, 137, 143, 175, 176, 177 R, 179

[56] References Cited

U.S. PATENT DOCUMENTS 5,172,076 12/1992 Brown .................................. 331/57

*Primary Examiner*—David Mis

*Attorney, Agent, or Firm*—Brumbaugh, Graves, Donohue & Raymond

[57] ABSTRACT

A voltage control oscillation circuit comprises an oscillation loop and a control current generating circuit. The oscillation loop comprises: a first charge-discharge circuit including a first transistor circuit for converting a reverse voltage signal as a first input voltage into a first charge-discharge current according to a first conversion ratio, and a first capacitor which is charged and discharged by the first charge-discharge current for generating a first charge-discharge voltage signal; a second charge-discharge circuit including a second transistor circuit for converting the first charge-discharge voltage signal as a second input voltage into a second charge-discharge current according to a second conversion ratio, and a second capacitor which is charged and discharged by the second charge-discharge current for generating a second charge-discharge voltage signal; and a reverse circuit for reversing the second charge-discharge voltage signal into the reverse voltage signal. The control current generating circuit comprises: a voltage-to-current conversion circuit for converting the control voltage into a first control current; and a current value regulating circuit including a resistor circuit constituted by a plurality of resistors for generating a regulating current corresponding to a resistance value of the resistor circuit; and means for generating a second control current by adding the regulating current to the first control current.

6 Claims, 3 Drawing Sheets

VOLTAGE CONTROL OSCILLATION CIRCUIT

BACKGROUND OF THE INVENTION

1. Field of the Invention

The present invention relates to voltage control oscillation circuits, and more particularly to improvements in voltage control oscillation circuits for use in signal processing circuits of audio equipment, imaging equipment or the like.

2. Prior Art

FIG. 1 shows a conventional voltage control oscillation circuit. In FIG. 4, numeral reference 31 denotes a charge-discharge switching circuit, 32 a capacitor, 33 a discharge resistor, and 34 a control voltage input terminal.

The charge-discharge switching circuit 31 is constituted by a circuit for charging and discharging the capacitor 32 alternately, and charging voltage has two threshold values, that is, an upper and a lower threshold value. When a charging voltage reaches the upper threshold value in the capacitor 32, the charging of the capacitor 32 is suspended. Then, the capacitor 32 is discharged by the discharge resistor 33 which is connected thereto in parallel, as a result of which the charging voltage drops. When the charging voltage drops up to the lower threshold value, the charge-discharge switching circuit 31 operates so as to charge the capacitor 32.

Since the capacitor 32 is charged with current surpassing discharging current by means of the discharge resistor 33, the charging voltage rises and reaches the upper threshold value in the capacitor 32. The process mentioned above is repeated in the same manner so that a saw tooth or triangular oscillating signal is output.

Further, either upper or lower threshold value varies according to the control voltage received via the control voltage input terminal 34, thus causing the amplitude of the oscillating signal to vary. On the other hand, charge-discharge constants for use in defining the inclination of the oscillating signal and the like are fixed. Therefore, the oscillating frequency varies with the repetitive period. The oscillating frequency of the output signal is thus controlled by the control voltage.

However, an oscillating circuit of the sort set forth above needs an externally-installed capacitor with relatively large capacity, and this tends to render such an oscillating circuit liable to frequency fluctuations due to aging change of the capacitor. FIG. 2 illustrates an exemplary voltage control oscillation circuit using a ceramic or quartz oscillator 41 in order to improve aging and temperature change characteristics. In this case, the oscillating frequency of the output signal is still controlled as charge-discharge time constants to capacitors 42 and 43 vary with the control voltage via a terminal 44.

FIG. 3 illustrates an exemplary oscillation circuit using an operational amplifier, wherein oscillation is carried out by charging and discharging a capacitor 52 via a resistor 51, and a capacitor 54 via a resistor 53. The resistance of this circuit is replaced with a circuit equivalent to a variable resistor, though the illustration thereof has been omitted. Moreover, the oscillating frequency is controlled as the apparent resistance value of the equivalent circuit varies with the control voltage.

The circuit shown in FIG. 1 requires an external regulating circuit to secure an accurate oscillating frequency. In the case of such a conventional voltage control oscillation circuit, it is impossible to make the whole circuit an IC even though an attempt is made to do so. Moreover, a capacitor of large capacity is required for the charge-discharge switching circuit 31 shown in FIG. 1 and the operational amplifier circuit shown in FIG. 3 to obtain an oscillating signal at a stable oscillating frequency. In other words, such a capacitor must be connected to the circuit as an external part because it is hardly possible to incorporate the capacitor into an IC. Consequently, the oscillating frequency tends to fluctuate because of the aging change of the capacitor.

Particularly when a low-frequency oscillating signal is needed, the oscillating condition will become unstable under the influence of leakage current, noise or the like if the charge-discharge time constants are increased simply by increasing the resistance value of a built-in resistor. As a result, an extremely large capacity capacitor will have to be used instead. However, such a large capacity capacitor has disadvantages, in addition to those mentioned above, in that it is not only expensive but also inferior in reliability. Moreover, there arises such a problem that it may incur a reduction in packaging density.

The practice usually taken up to remedy the aforesaid disadvantages is to use, for example, a ceramic oscillator for generating a high-frequency oscillating signal once (FIG. 1) and then to divide the frequency. However, the necessity of dividing the frequency repeatedly until the frequency required is obtained would result in a sharp increase in the area of the frequency divider on chip. A resulting increase in the chip area tends to decrease a yield of chips per wafer and the yield itself, thus increasing IC production cost. In view of securing desired packaging density, the arrangement stated above is disadvantageous because the oscillator has to be installed externally.

SUMMARY OF THE INVENTION

The present invention is conducted to solve the foregoing problems in the conventional circuit, and an object of the present invention is to provide a voltage control oscillation circuit capable of stably maintaining oscillation even at low frequencies and fit for circuit integration as a whole without the oscillating frequency being hardly affectable by aging change.

The above object of the present invention has been performed by provision of a voltage control oscillation circuit which controls the oscillating frequency of an output signal according to control voltage, comprising an oscillation loop and a control current generating circuit.

The oscillation loop comprises: a first charge-discharge circuit including a first transistor circuit which receives a reverse voltage signal as a first input voltage for converting said first input voltage into a first charge-discharge current according to a first conversion ratio, a first capacitor which is charged and discharged by said first charge-discharge current for generating a first charge-discharge voltage signal; a second charge-discharge circuit including a second transistor circuit which receives said first charge-discharge voltage signal as a second input voltage for converting said second input voltage into a second charge-discharge current according to a second conversion ratio for generating a second charge-discharge voltage signal; and a reverse circuit which receives said second charge-discharge voltage signal for generating said reverse voltage signal; and means for outputting one of said reverse voltage Signal, said first and second charge-discharge voltage signals as an output signal.

Further, the control current generating circuit comprises a voltage-to-current conversion circuit for converting said control voltage into a first control current; and a current value regulating circuit including a resistor circuit constituted by a plurality of resistors for generating a regulating current corresponding to a resistance value of said resistor circuit; and means for generating a second control current by adding said regulating current to said first control current or by subtracting said regulating current from said first control current.

Further, the operating currents of the first and second transistor circuits are so controlled by the second control current as to vary the first and second conversion ratios in the oscillation loop, whereby the oscillating frequency of the output signal is kept under control.

More specifically, so-called variable amplifiers and the like may be used as the first and second transistor circuits.

In the voltage control oscillation circuit thus organized according to the present invention, the ratio at which the input voltage is converted to the charge-discharge current is determined by the transistor circuit operating at the current complying with the control current. With this arrangement, the value of the conversion ratio can be set in a wider range so as to cover sufficiently small values and this makes it possible to exert stable charge-discharge control even though a minute charge-discharge current is applied. As the charge-discharge current is made smaller, the charge-discharge time constant may be maintained even if the capacity of the charge-discharge capacitor is decreased correspondingly. The oscillating frequency in the oscillation loop is thus preserved.

Therefore, a charge-discharge capacitor whose capacity has thus be reduced may be incorporated in an IC without impairing the range of controlling the oscillating frequency of the output signal.

The control voltage is converted into a control current once. Then, the control current is subjected by the regulating current to adjustment before being used to control the oscillation loop. In this case, the regulating current is arranged so that it is determined according to the resistance value of the resistor circuit having a plurality of resistors. Consequently, the resistance value may be set by varying the connections of some resistors prior to IC packaging. By presetting the regulating current value in this manner, the reference value of the operating current of the transistor circuit liable to variation in the conversion ratio can be regulated so as to arrange the conversion ratios in the transistor circuits in order beforehand.

The voltage control oscillation circuit after being packaged in IC thus stably oscillates at a predetermined oscillating frequency with respect to the control voltage as a reference. Therefore, no externally-installed adjusting parts are required.

The voltage control oscillation circuit according to the present invention is able to cover very low-frequency oscillation with stability. Moreover, the whole circuit including even the regulating circuit can be incorporated into an IC, whereby an oscillation circuit substantially free from frequency variation due to the aging change of the capacitor can be put to practical use.

DETAILED DESCRIPTION OF THE PREFERRED EMBODIMENTS

Referring to a block diagram of FIG. 4 and a circuit diagram of FIG. 5, a description will be given of an voltage control oscillation circuit according to one embodiment of the present invention.

Figure 1:
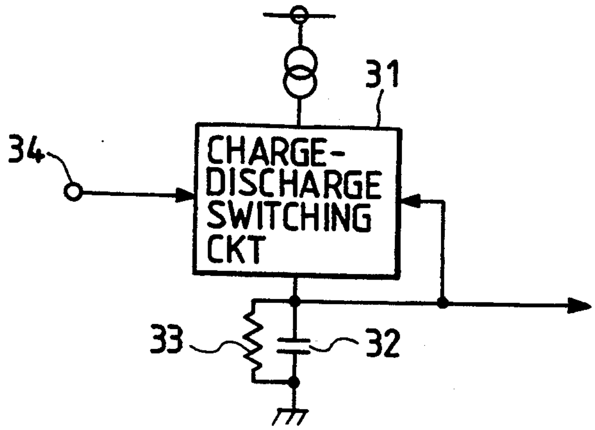
FIG. 1 is a diagram showing a first example of a conventional voltage control oscillation circuit.
Figure 2:
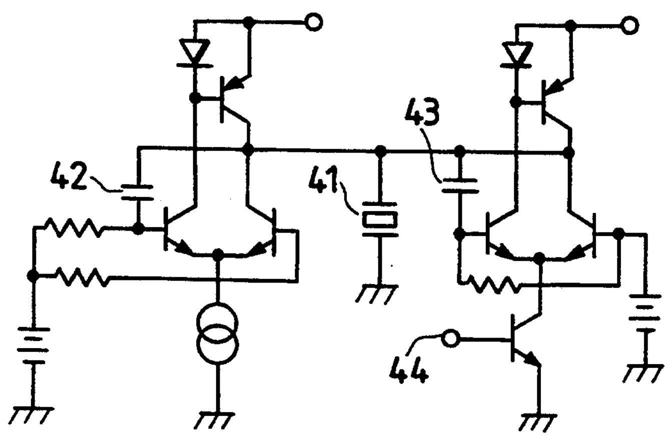
FIG. 2 is a diagram showing a second example of a conventional voltage control oscillation circuit.
Figure 3:
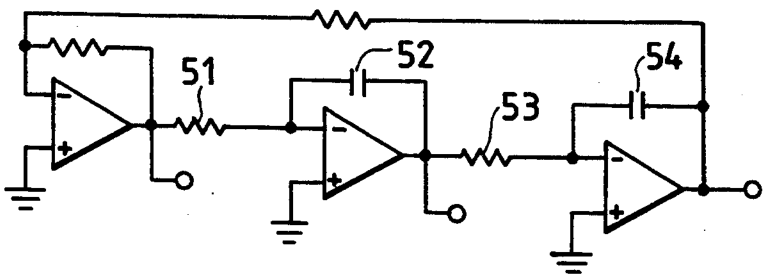
FIG. 3 is a diagram showing a third example of a conventional oscillation circuit.
Figure 4:
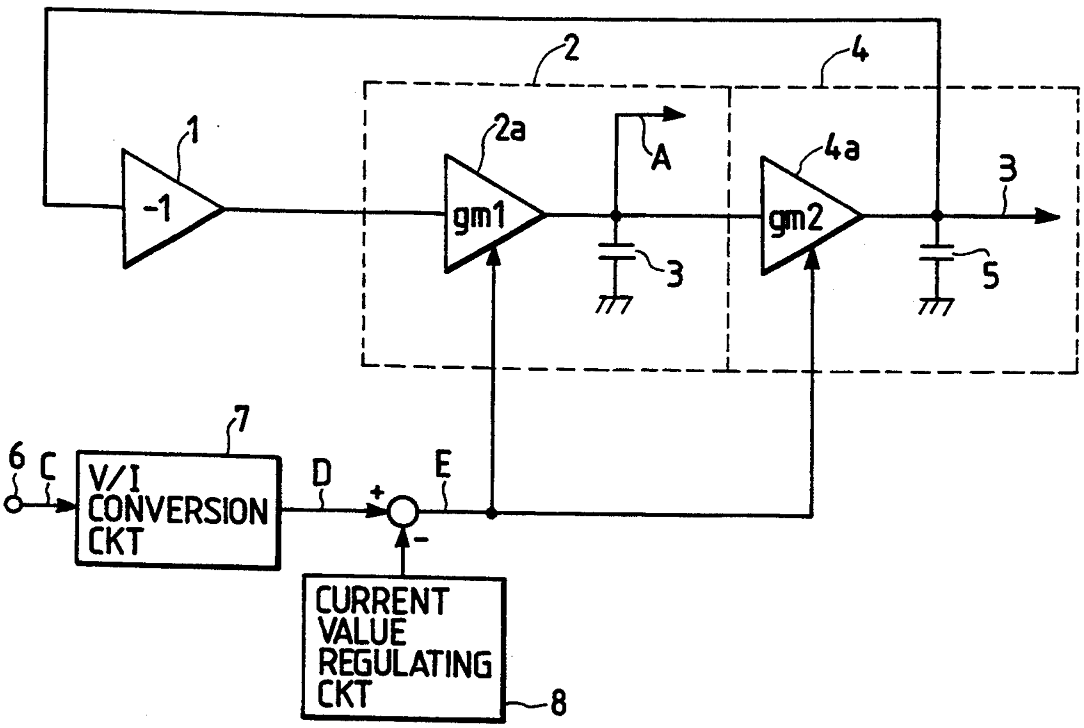
FIG. 4 is a block diagram showing a voltage control oscillation circuit according to an embodiment of the present invention.
Figure 5:
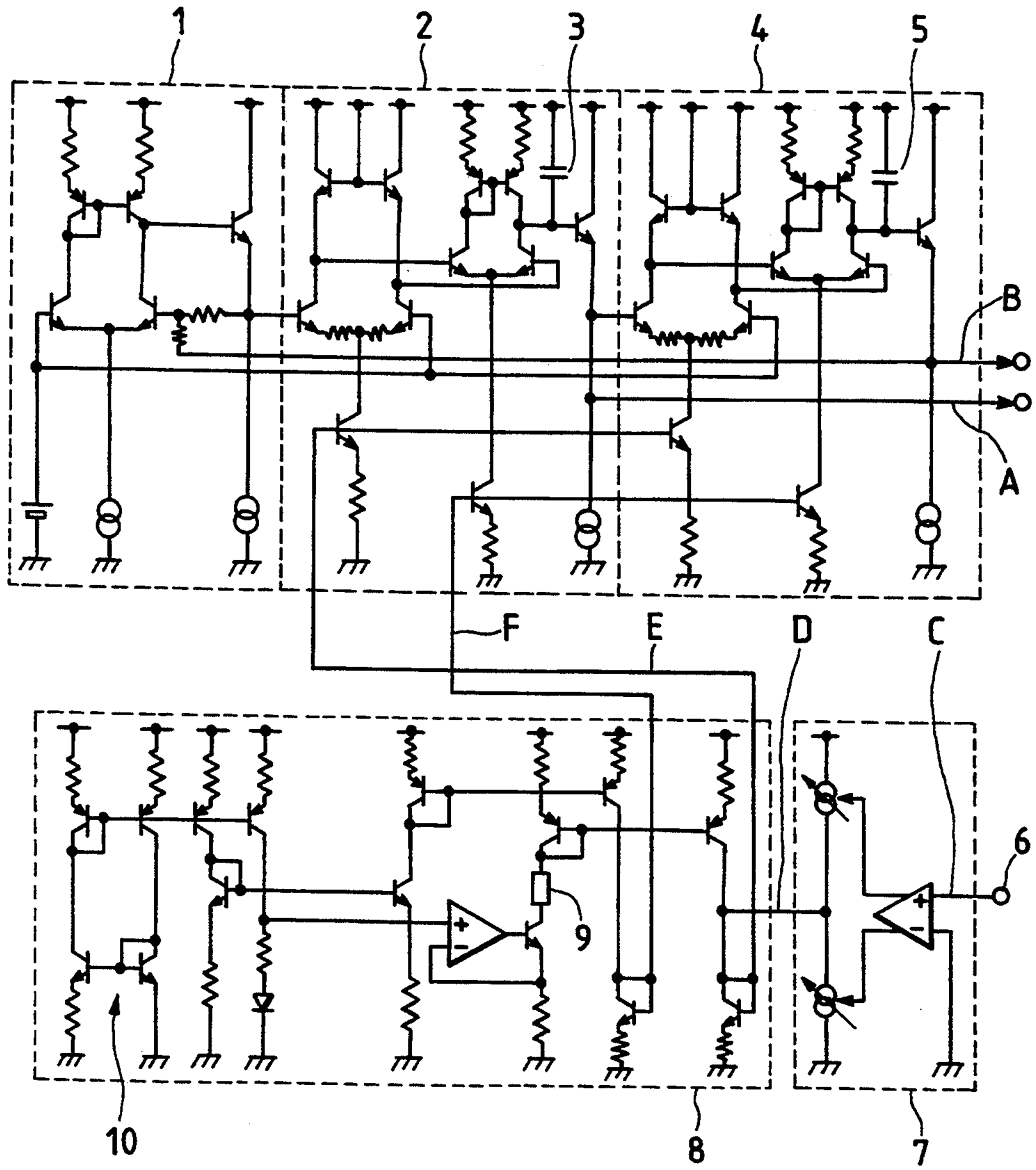
FIG. 5 is a circuit diagram corresponding to the voltage control oscillation circuit of FIG. 4.

In FIG. 4, numeral reference 1 denotes a reverse amplifier, 2 a charge-discharge circuit, 2*a* a variable amplifier, 3 a capacitor, 4 a charge-discharge circuit, 4*a* a variable amplifier, 5 a capacitor, 6 a terminal for inputting control voltage, 7 a voltage-current conversion circuit (V/I conversion circuit), 8 a current value regulating circuit, 9 a resistor circuit, and 10 a temperature compensating circuit.

The reverse amplifier 1, the charge-discharge circuits 2 and 4 are connected together in the stated order to form an oscillation loop. A signal A resulting from a charge-discharge voltage in the charge-discharge circuit 2 and a signal B resulting from a charge-discharge voltage in the charge-discharge circuit 4 are produced as output signals, respectively. At this time, the charge-discharge voltages are output not directly but via respective transistors during producing the output signals A and B so that the output signals are not affected by the output side.

The charge-discharge circuit 2 receives a reverse voltage signal as an input voltage and the amplifier 2*a* converts the input voltage into a charge-discharge current. Further, the charge-discharge current is used to charge and discharge the capacitor 3, whereby the charge-discharge voltage signal A is produced. As the capacitor 3 is charged and discharged, the charge-discharge voltage signal A lags behind the reverse voltage signal by a phase difference of 90°.

The charge-discharge circuit 4 is the same in construction as the charge-discharge circuit 2, and on receiving the charge-discharge voltage signal A, produces the charge-discharge voltage signal B which lags behind the reverse voltage signal by an additional phase difference of 90°.

The charge-discharge voltage signal B thus produced is reversed by the reverse amplifier 1, resulting in producing the reverse voltage signal which lags by a further phase difference of 180°. The reverse voltage signal obtained through a series of steps above indicates a 360° phase shift, and is said to be what is regained before the series of steps have been taken. Therefore, the oscillation loop is allowed to oscillate continuously.

The oscillating frequency in this case is affected by the charge-discharge current and the capacity of the capacitor. Moreover, the transistor circuit (i.e., the variable amplifier in the embodiment shown) is used to generate the charge-discharge current, and the operating current of the transistor circuit is controlled by a control current E so as to control the level of the charge-discharge current.

In other words, the charge-discharge current is generated as, for example, a differential signal, which is controlled by the operating current which has a higher current value level and is readily controllable. Even when the charge-discharge current is a minute one, its current value level remains stable. Consequently, the charge-discharge time constants can be kept at greater values even though the capacities of the capacitors 3 and 5 are small. On condition that the capacities of the capacitors are small, these capacitors may be incorporated into one IC without greatly increasing a chip area. Moreover, noise is minimized as the oscillating signal has a signal waveform having a harmonic function without including a higher harmonic.

As a result, the oscillation loop thus arranged is capable of oscillation with stability at lower frequencies and also allows even charge-discharge capacitors to be incorporated in one IC.

However, the amplification factors and capacities of the amplifiers *2a*, *4a* and the capacitors 3, 5 are subject to variations originating from the conditions under which they have been manufactured and these variations cannot be ignored. If the whole circuit is simply converted into an IC, the oscillating frequencies of ICs will tend to vary widely even though they are given one and the same voltage as a control voltage C applied via the terminal 6.

This would necessitate adding a regulating circuit to the circuit in which an IC has been adopted, and after incorporating the circuit into equipment, regulating it case-by-case.

As a result, in this embodiment, the V/I conversion circuit 7 and the current value regulating circuit 8 are provided to deal with the aforesaid problem. Moreover, the current value regulating circuit 8 is equipped with the resistor circuit 9. The resistor circuit 9 in this example has four resistors connected in parallel and set at a ratio of 1 to 2 to 4 to 8 in terms of resistance values. It is therefore possible to set 16 kinds of resistance values with combinations of remaining resistors by optionally cutting the connections of these resistors with, for example, a laser trimming device. The regulating current is determined by the resistance value of the resistor circuit 9. A control current D resulting from the conversion of the control voltage C is ultimately made the control current E with the regulating current subtracted therefrom. The operating currents of the amplifiers *2a*, *4a* are caused to vary with the control current E as stated above.

Then, the oscillating frequency of, for example, the signal A is measured by giving a reference voltage as the control voltage C at an IC probe test stage. According to the degree to which the oscillating frequency has deviated from a reference oscillating frequency, a resistance value which may offset the deviation most favorably is selected from those of the resistor circuit 9 before being set as stated above.

The voltage control oscillation circuit regulated at the stage where its IC has been manufactured is set almost free from variations and fluctuations in oscillating frequency characteristics and the like, and is made to perform stable operations. On receiving the predetermined control voltage C, the voltage control oscillation circuit outputs the signals A and B at the predetermined oscillating frequencies without any adjustment.

As a result, the circuit using this IC needs no regulating circuit, and what has been incorporated into equipment also needs no adjusting.

Therefore, the voltage control oscillation circuit thus arranged according to the present invention is able to cover even very low-frequency oscillation with stability. Moreover, the whole circuit including such a regulating circuit can be integrated into one chip and requires no adjustment later.

The resistor circuit according to this embodiment has been shown by way of example. The number of resistors constituting the resistor circuit may be increased in compliance with the accuracy required. The resistor circuit may otherwise comprise resistors having the same resistance value or may be what includes those connected in series.

Moreover, the temperature compensating circuit 10 has been provided as part of the current value regulating circuit 8 according to the embodiment, whereby not only the control current E but also a signal F intended for a constant current source, which is not to be controlled, is compensated for in terms of temperatures, so that the temperature characteristics are improved further.

Figure 6:
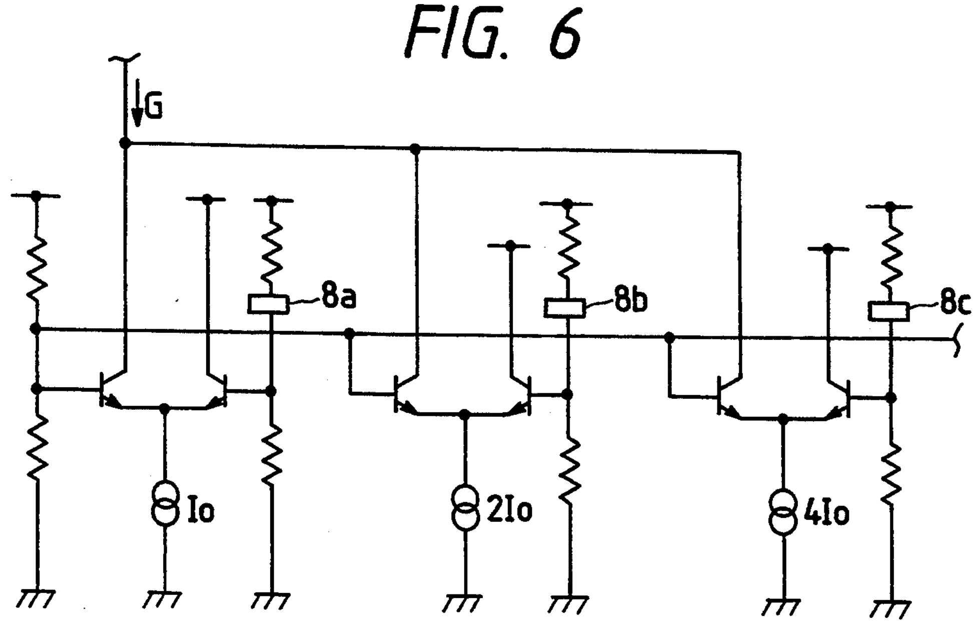
FIG. 6 is a circuit diagram showing a current value regulating circuit in the voltage control oscillation circuit according to the present invention.

FIG. 6 shows a specific current value regulating circuit arrangement. In this case, a plurality of constant current circuits are lined up and the total sum of currents G is set as the regulating current. A resistor circuit with two resistors connected in series is correspondingly produced in each constant current circuit, and a constant current having a current value IO, 2×IO, 4×IO . . . flows therethrough in the initial state, depending on the divided voltage. Further, the constant current in the constant current circuit corresponding to the cut resistor circuit is stopped when spots *8a*, *8b*, *8c* . . . are cut. The regulating current can be set in the same manner as stated above with effects similar to those exemplified above.

As will be understood from the description given so far, the variable amplifiers and the capacitors constitute the charge-discharge circuit of the oscillation loop in the voltage control oscillation circuit thus arranged according to the present invention. As a result, the capacity of the capacitor can be decreased, whereas the oscillation loop can be incorporated into one IC. With the provision of the current value regulating circuit having the resistor circuit, the control current is adjusted beforehand by setting the resistance value and this makes unnecessary an externally-installed circuit such as the regulating circuit. As a result, even low-frequency oscillation can be secured with stability. Moreover, the whole circuit can be integrated into one IC with the effect of making its oscillating frequency hardly affected by the secular change of the capacitor or the like.

What is claimed is:

1. A voltage control oscillation circuit in the oscillating frequency of an output signal is controlled according to control voltage, said circuit comprising:

a first charge-discharge circuit including a first transistor circuit which receives a reverse voltage signal as a first input voltage for converting said first input voltage into a first charge-discharge current according to a first conversion ratio, and a first capacitor which is charged and discharged by said first charge-discharge current for generating a first charge-discharge voltage signal;

a second charge-discharge circuit including a second transistor circuit which receives said first charge-discharge voltage signal as a second input voltage for converting said second input voltage into a second charge-discharge current according to a second conversion ratio, and a second capacitor which is charged and discharged by said second charge-discharge current for generating a second charge-discharge voltage signal;

a reverse circuit for reversing said second charge-discharge voltage signal to generate said reverse voltage signal;

a voltage-to-current conversion circuit for converting said control voltage into a first control current;

a current value regulating circuit for generating a regulating current; and means for generating a second control current from said regulating current and said first control current, to output said second control current to said first and second transistor circuits, respectively, wherein one of said reverse voltage signal and said first and second charge-discharge voltage signals is output as said output signal, and the operation current of said first and second transistor circuits is controlled according to said second control current so as to vary said first and second conversion ratios to control the oscillating frequency of said output signal.

2. A voltage control oscillation circuit as claimed in claim 1, wherein said second control current generating means adds said regulating current to said first control current to generate said second control current.

3. A voltage control oscillation circuit as claimed in claim 1, wherein said second control current generating means subtracts said regulating current from said first control current to generate said second control current.

4. A voltage control oscillation circuit as claimed in claim 1, wherein said current value regulating circuit comprises a resistor circuit including a plurality of resistors for generating said regulating current corresponding to a resistance value of said resistor circuit.

5. A voltage control oscillation circuit as claimed in claim 1, wherein said current value regulating circuit comprises a plurality of constant current circuits having a plurality of resistors, each for allowing a constant current corresponding to voltages generated by divided voltages of said plurality of resistors to flow, and means for summing said constant currents in said plurality of constant current circuits as said regulating current.

6. A voltage control oscillation circuit as claimed in claim 1, wherein said first and second charge-discharge circuits comprise a variable amplifier, respectively.

* * * * *